(12) United States Patent
Kando

(10) Patent No.: US 7,772,742 B2
(45) Date of Patent: Aug. 10, 2010

(54) BOUNDARY ACOUSTIC WAVE DEVICE

(75) Inventor: Hajime Kando, Ritto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 103 days.

(21) Appl. No.: 12/270,895

(22) Filed: Nov. 14, 2008

(65) Prior Publication Data

US 2009/0066189 A1    Mar. 12, 2009

Related U.S. Application Data

(63) Continuation of application No. PCT/JP2007/059760, filed on May 11, 2007.

(30) Foreign Application Priority Data

May 30, 2006    (JP)    .............................. 2006-149854

(51) Int. Cl.
*H01L 41/08*    (2006.01)
(52) U.S. Cl. .............................. 310/313 A; 310/313 R; 310/346
(58) Field of Classification Search ............. 310/313 R, 310/313 A, 346
See application file for complete search history.

(56) References Cited

U.S. PATENT DOCUMENTS

| 5,998,907 | A | 12/1999 | Taguchi et al. |
| 6,737,941 | B1 | 5/2004 | Tournois |
| 7,322,093 | B2 | 1/2008 | Kadota et al. |
| 7,581,306 | B2 * | 9/2009 | Kadota et al. ................. 29/594 |
| 2005/0099091 | A1 | 5/2005 | Mishima et al. |
| 2006/0071579 | A1 | 4/2006 | Kando |
| 2006/0138902 | A1 * | 6/2006 | Kando ..................... 310/313 D |
| 2007/0222337 | A1 * | 9/2007 | Kadota et al. ............... 310/320 |
| 2007/0284965 | A1 * | 12/2007 | Kadota et al. ........... 310/313 R |

FOREIGN PATENT DOCUMENTS

| EP | 1 635 459 A1 | 3/2006 |
| JP | 07-212174 A | 8/1995 |
| JP | 2001-044787 A | 2/2001 |
| WO | 98/52279 A1 | 11/1998 |

OTHER PUBLICATIONS

Official Communication issued in corresponding European Patent Application No. 07743195.5, mailed on Jan. 7, 2010.
Yamaguchi et al., "Highly Piezoelectric Boundary Waves in Si/SiO2/LiNBO3 Structure," 1998 IEEE International Frequency Control Symposium, 1998, pp. 484-488.
Official Communication issued in International Patent Application No. PCT/JP2007/059760, mailed on Aug. 14, 2007.

(Continued)

*Primary Examiner*—Mark Budd
(74) *Attorney, Agent, or Firm*—Keating & Bennett, LLP

(57) ABSTRACT

A boundary acoustic wave device includes a first medium, a second medium, a third medium, and a fourth medium that are laminated in that order and, an electrode including an IDT electrode disposed at an interface between the first medium and the second medium, the temperature coefficient of delay time TCD of a boundary acoustic wave has a positive value, the fourth medium or the second medium has a positive temperature coefficient of sound velocity TCV, the first medium has a negative temperature coefficient of sound velocity TCV, and the sound velocity of transverse wave of the third medium is set to be less than the sound velocity of transverse wave of the fourth medium and/or the second medium.

10 Claims, 7 Drawing Sheets

OTHER PUBLICATIONS

Ohbuchi et al.: "Analysis of Excitation Characteristics of Interdigital Saw Transducers Using Coupling-of-Modes Theory," Institute of Electrons; Information and Communication Engineers of Japan; Technical Report; MW90-62; 1990; pp. 69-74.

Mitobe et al.: "Finite-Element Analysis of Periodically Perturbed Piezoelectric Waveguides," Transactions of Institute of Electronics and Communication Engineers of Japan; vol. J68-C, No. 1; Jan. 1985; pp. 21-27.

* cited by examiner

BOUNDARY ACOUSTIC WAVE DEVICE

BACKGROUND OF THE INVENTION

1. Field of the Invention

The present invention relates to a boundary acoustic wave device used as, for example, resonators and filters. In particular, the present invention relates to a boundary acoustic wave device including an electrode which is disposed between a first medium and a second medium, and a third medium and a fourth medium are laminated on the second medium.

2. Description of the Related Art

In recent years, boundary acoustic wave devices have been used as resonators and band pass filters because the package structures thereof can be simplified.

WO2004-070946 discloses a boundary acoustic wave device, wherein the electromechanical coefficient is relatively large, the propagation loss and the power flow angle are relatively small, and the temperature coefficient of resonant frequency TCF is within an appropriate range. Here, an IDT electrode is disposed at an interface between a first medium made of a piezoelectric substrate and a second medium made of a $SiO_2$ film. Furthermore, the electromechanical coefficient and the temperature characteristics can be adjusted by adjusting the crystal orientation of a piezoelectric single crystal used as the piezoelectric substrate, the material defining the IDT electrode, the film thickness, and the electrode finger pitch.

WO2005-093949 discloses a boundary acoustic wave device 101 schematically shown in FIG. 12. In the boundary acoustic wave device 101, the IDT electrode 115 is disposed at the interface between the first medium 111 made of a Y-cut X-propagation $LiNbO_3$ substrate and the second medium 112 made of a $SiO_2$ film. Furthermore, a third medium 113 made of a polycrystalline Si layer and a fourth medium 114 made of a $SiO_2$ film are laminated on the second medium 112 in that order.

Here, WO2005-093949 describes that frequency adjustment can be performed by laminating the second medium 112 to the fourth medium 114. That is, the electrode 115 is disposed between the first medium 111 having a film thickness of H1 and the second medium 112 having a film thickness of H2, and the third medium 113 having a film thickness of H3 is laminated, so that a laminate is obtained. The frequency control is conducted at this laminate stage. Then, the fourth medium 114 having a film thickness of H4 is laminated on the third medium 113. In the boundary acoustic wave device 101, the energy of the boundary wave is as shown in the right-hand portion of FIG. 12. That is, in the fourth medium, the energy is distributed to only a small portion. Therefore, when the frequency control is performed at the above-described laminate stage and variations in frequency are reduced significantly, even when the fourth medium 114 is formed, it is possible to reduce variations in frequency.

In the boundary acoustic wave device described in WO2004-070946, when the substrate crystal orientation of the piezoelectric single crystal defining the piezoelectric substrate and the configuration of the IDT electrode are determined, the temperature coefficient of resonant frequency TCF and the temperature coefficient of delay time TCD are automatically determined. Therefore, it is difficult to obtain a boundary acoustic wave device having desired temperature characteristics.

On the other hand, in the boundary acoustic wave device described in WO2005-093949, the frequency adjustment in the production stage can easily be performed by laminating the second medium to the fourth medium, as described above. Therefore, the boundary acoustic wave device exhibiting reduced variations in frequency can be provided. However, as is clear from the temperature coefficient of resonant frequency TCF shown in FIG. 10 in WO2005-093949, the temperature coefficient of resonant frequency TCF may deteriorate because the above-described third medium layer made of a polycrystalline Si layer is laminated.

SUMMARY OF THE INVENTION

To overcome the problems described above, preferred embodiments of the present invention provide a boundary acoustic wave device formed by laminating a plurality of media, wherein changes in characteristics due to temperature are significantly reduced.

According to a preferred embodiment of the present invention, a boundary acoustic wave device includes a first medium, a second medium, a third medium, and a fourth medium that are laminated in that order and an electrode disposed at an interface between the first medium and the second medium, wherein the temperature coefficient of delay time TCD of a boundary acoustic wave or a surface acoustic wave in a structure formed by laminating the fourth medium/the second medium/the electrode/the first medium has a positive value, the fourth medium or the second medium has a positive temperature coefficient of sound velocity TCV and the first medium has a negative temperature coefficient of sound velocity TCV, and the sound velocity of transverse wave in the third medium is less than the sound velocity of transverse wave in the fourth medium and/or in the second medium.

Preferably, the first medium is made of a piezoelectric substrate, the second medium is made of a silicon oxide film, the third medium is made of a tantalum oxide film or a zinc oxide film, and the fourth medium is made of a silicon oxide film. The third medium made of the tantalum oxide film or the zinc oxide film having a sound velocity of transverse wave that is less than that in the silicon oxide film is disposed between the second medium and the fourth medium made of the silicon oxide film. Therefore, according to preferred embodiments of the present invention, the third medium having the sound velocity of transverse wave that is less than the sound velocities of transverse waves of the fourth medium and the second medium is arranged such that a boundary acoustic wave device having a small absolute value of temperature coefficient of delay time TCD and good temperature characteristics can be reliably provided.

According to another preferred of the present invention, a boundary acoustic wave device includes a first medium, a second medium, a third medium, and a fourth medium that are laminated in that order and an electrode is disposed at an interface between the first medium and the second medium, wherein the temperature coefficient of delay time TCD of a boundary acoustic wave or a surface acoustic wave in a structure formed by laminating the fourth medium/the second medium/the electrode/the first medium has a negative value, the fourth medium or the second medium has a negative temperature coefficient of sound velocity TCV and the first medium has a positive temperature coefficient of sound velocity TCV, and the sound velocity of transverse wave in the third medium is less than the sound velocity of transverse wave in the fourth medium and/or the second medium.

According to another preferred embodiment of the present invention, a boundary acoustic wave device includes a first medium, a second medium, a third medium, and a fourth medium that are laminated in that order and an electrode is disposed at an interface between the first medium and the second medium, wherein the temperature coefficient of delay time TCD of a boundary acoustic wave or a surface acoustic wave in a structure formed by laminating the fourth medium/ the second medium/the electrode/the first medium has a positive value, the fourth medium or the second medium has a negative temperature coefficient of sound velocity TCV and the first medium has a positive temperature coefficient of sound velocity TCV, and the sound velocity of transverse wave in the third medium is greater than the sound velocity of transverse wave in the fourth medium and/or the second medium.

According to another preferred embodiment of the present invention, a boundary acoustic wave device includes a first medium, a second medium, a third medium, and a fourth medium that are laminated in that order and an electrode is disposed at an interface between the first medium and the second medium, wherein the temperature coefficient of delay time TCD of a boundary acoustic wave or a surface acoustic wave in a structure formed by laminating the fourth medium/ the second medium/the electrode/the first medium has a negative value, the above-described fourth medium or the second medium has a positive temperature coefficient of sound velocity TCV and the first medium has a negative temperature coefficient of sound velocity TCV, and the sound velocity of transverse wave in the third medium is faster than the sound velocity of transverse wave in the fourth medium and/or the second medium.

In this preferred embodiment, preferably, the first medium is made of a piezoelectric substrate, the second medium and the fourth medium are made of silicon oxide films, and the third medium is made of a silicon film or a silicon nitride film. In this case, the third medium made of a silicon film or a silicon nitride film having the sound velocity of transverse wave greater than that in a silicon oxide film is disposed between the second medium and the fourth medium made of the silicon oxide film. Therefore, the third medium having the sound velocity of transverse wave greater than the sound velocities of transverse waves in the fourth medium and the second medium is disposed, so that a boundary acoustic wave device having a small absolute value of temperature coefficient of delay time TCD and outstanding temperature characteristics can be reliably provided.

According to preferred embodiments of the present invention, preferably, at least one IDT electrode is provided as the electrode. That is, a boundary acoustic wave is efficiently excited by the at least one IDT electrode. Therefore, according to preferred embodiments of the present invention, a boundary acoustic wave device having a good temperature characteristic of delay time can be provided by using of the boundary acoustic wave.

In the boundary acoustic wave device according to preferred embodiments of the present invention, in the structure in which the first medium to the fourth medium are laminated in that order and the electrode is disposed at the interface between the first medium and the second medium, the sound velocity of transverse wave in the third medium is preferably less than the sound velocity of transverse wave in the fourth medium and/or the second medium. Therefore, the absolute value of temperature characteristic of delay time TCD can be reduced and a boundary acoustic wave device having outstanding temperature characteristics can be provided.

The reason for this is believed to be as described below. The vibration energy tends to more readily concentrate on the low sound velocity medium side. Therefore, when the sound velocity of transverse wave in the third medium is less than the sound velocity of transverse wave in the fourth medium and/or the second medium, the vibration energy of the transverse wave is highly distributed into the third medium. Consequently, the vibration energy of the transverse wave is also highly distributed into the second medium and the fourth medium, so that the temperature coefficient of delay time TCD of the boundary acoustic wave can be reduced. Conversely, according to other preferred embodiments of the present invention, the sound velocity of transverse wave of the third medium is greater than the sound velocity of transverse wave of the second medium and the fourth medium, and, thereby, the energy distribution of the transverse wave into the second medium and the fourth medium can be reduced.

Therefore, according to preferred embodiments of the present invention, a boundary acoustic wave device in which changes in characteristics due to temperature are small can be reliably easily provided.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Preferred embodiments of the present invention will be described below with reference to the drawings.

Figure 1A:
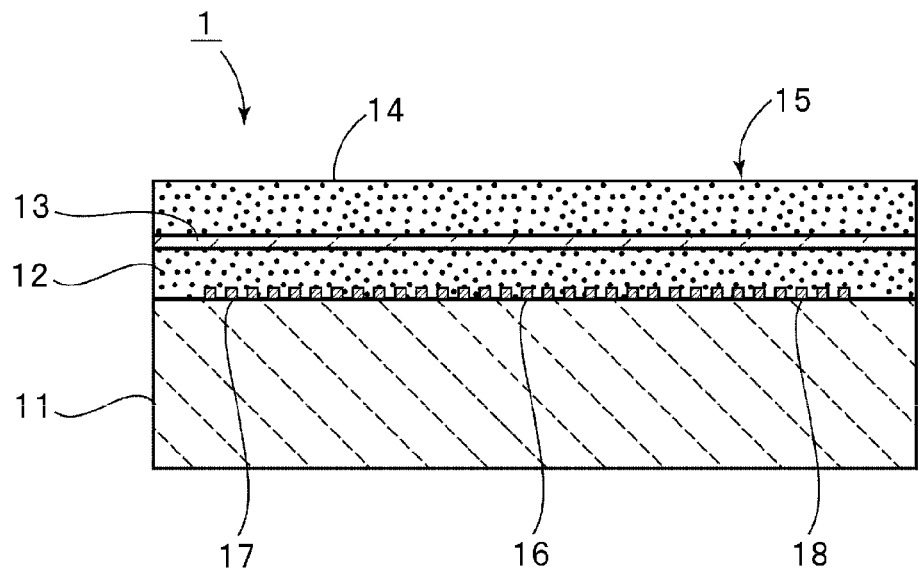
FIGS. 1A and 1B are a schematic sectional front view of a boundary acoustic wave device according to a preferred embodiment of the present invention and a schematic plan view showing an electrode structure.
Figure 1B:
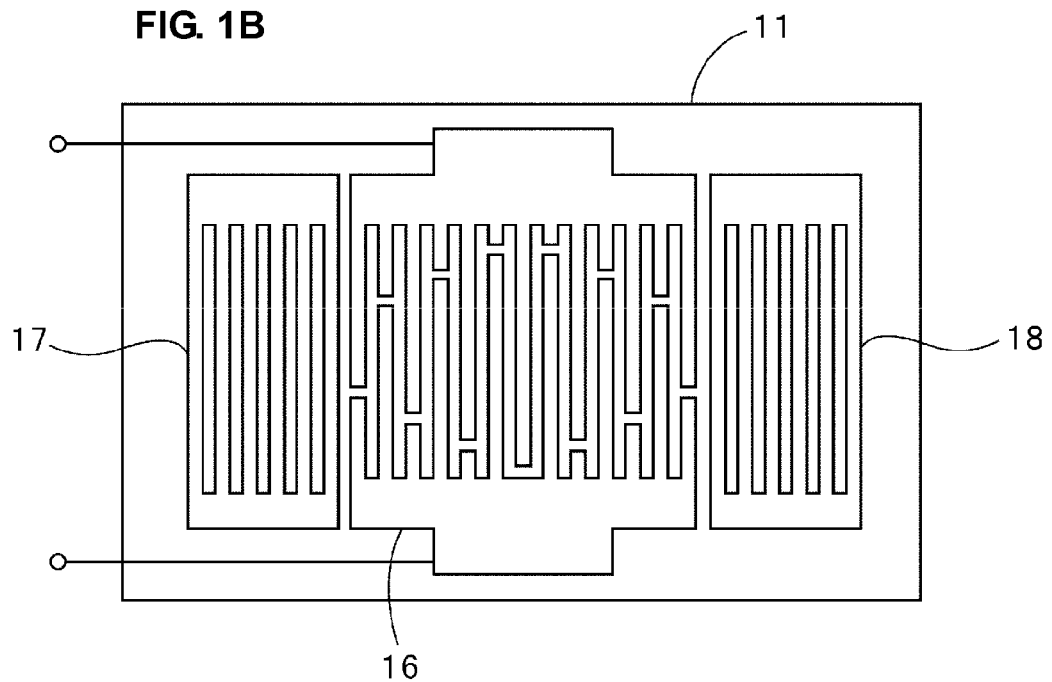

FIGS. 1A and 1B are a schematic sectional front view of a boundary acoustic wave device according to a preferred embodiment of the present invention and a schematic plan view showing an electrode structure.

A boundary acoustic wave device 1 includes a laminate 15 in which a first medium 11 to a fourth medium 14 are laminated in that order. Furthermore, an electrode structure shown in FIG. 1B is disposed at an interface between the first medium 11 and the second medium 12. That is, the above-described electrode structure includes an IDT electrode 16 and reflectors 17 and 18 disposed outside the IDT electrode 16 in a propagation direction of a boundary acoustic wave.

In the present preferred embodiment, the first medium 11 is preferably made of a 15°Y-cut X-propagation LiNbO$_3$ substrate. The first medium 11 may be made by using LiNbO$_3$ substrates having other crystal orientations or other piezoelectric single crystal substrates, e.g., a LiTaO$_3$ substrate. The first medium 11 may be made of other piezoelectric materials, e.g., piezoelectric ceramic, and furthermore may have a structure in which a piezoelectric thin film is laminated on an insulating material.

In the present preferred embodiment, the second medium 12 is made of a SiO$_2$ film defining a silicon oxide film. In the present preferred embodiment, the third medium 13 is made of Ta$_2$O$_5$ defining as a tantalum oxide film. The fourth medium 14 is made of a SiO$_2$ film defining a silicon oxide film.

The sound velocity of transverse wave in the third medium 13 made of Ta$_2$O$_5$ is about 1,580 m/sec. On the other hand, the sound velocity of transverse wave in the second medium and the fourth medium made of SiO$_2$ is about 3,757 m/sec. That is, the sound velocity of transverse wave in the third medium is less than the sound velocity of transverse wave in the second medium 12 and the fourth medium 14. Furthermore, the sound velocity of transverse wave in ZnO is about 2,826 m/sec and, therefore, ZnO can be used as the third medium.

In the laminated structure in which the above-described fourth medium 14/the second medium 12/the IDT electrode 16/the first medium 11 are laminated, the temperature coefficient of delay time TCD of a boundary acoustic wave has a positive value. The temperature coefficient of delay time TCD is an index of a propagation property of an acoustic wave and is directly linked to an index of the performance of a device. The relationship with the temperature coefficient of resonant frequency TCF providing an index of the device performance is represented by TCF=−TCD.

In the present preferred embodiment, the sound velocity of transverse wave in the third medium 13 is less than the sound velocity of transverse wave in the second medium 12 and the sound velocity of transverse wave in the fourth medium 14. However, it is sufficient that the sound velocity of transverse wave in the third medium 13 is less than at least one of the sound velocity of transverse wave in the second medium 12 and the sound velocity of transverse wave in the fourth medium 14.

The temperature coefficient of sound velocity TCV has a positive value in the second medium and the fourth medium made of SiO$_2$. The temperature coefficient of sound velocity TCV is an index of the propagation performance of an acoustic wave except for the influence of the coefficient of linear expansion and shows the tendency of changes in sound velocity due to temperature changes except for the influence of the coefficient of linear expansion.

The temperature coefficient of sound velocity TCV in the LiNbO$_3$ substrate defining the first medium 11 has a negative value.

In the present preferred embodiment, the IDT electrode 16 and the reflectors 17 and 18 are made of a laminated metal film in which an Al layer is laminated on an Au layer, and the duty of the IDT electrode is preferably about 0.6, for example.

In the boundary acoustic wave device 1 of the present preferred embodiment, the sound velocity of transverse wave in Ta$_2$O$_5$ defining the third medium 13 is less than the sound velocity of transverse wave in the second medium 12 and the fourth medium 14 and, therefore, the energy of the transverse wave concentrates on the third medium. Consequently, the absolute value of the temperature coefficient of delay time TCD of a boundary acoustic wave which propagates at an interface between the first medium 11 and the second medium 12 is reduced, and good temperature characteristics are obtained. This will be described more specifically on the basis of comparisons with a boundary acoustic wave device in related art.

A boundary acoustic wave device of the related art has substantially the same configuration as the boundary acoustic wave device 1 of the above-described preferred embodiment except that the third medium 13 and the fourth medium 14 are not included. An IDT electrode, reflectors, a first medium, and a second medium were configured as shown in Table 1 below. The finite element method proposed in "Finite-Element Analysis of Periodically Perturbed Piezoelectric Waveguides" (Transactions of Institute of Electronics and Communication Engineers of Japan, Vol. J68-C No. 1. 1985/1 pp 21-27) was expanded, one strip is disposed within a half-wavelength interval, and the sound velocities at an upper edge and a lower edge of a stop band of an electrically open-circuit strip and a short-circuit strip were determined. Most of the vibration energy of boundary wave was concentrated on a portion from about 1λ above the IDT electrode to about 1λ below the IDT electrode. Therefore, the analysis region was specified to be a portion having a thickness of about 8λ in upward and downward directions of the IDT electrode, and the boundary conditions of the front surface and the back surface of the analysis region were elastically fixed.

Subsequently, $\kappa_{12}/k_0$ representing the amount of reflection of the boundary wave at a strip and the electromechanical coefficient $K^2$ were determined based on a method proposed in "Analysis of Excitation Characteristics of Interdigital SAW Transducers Using Coupling Modes Theory" (Institute of Electrons, Information and Communication Engineers of Japan, Technical Report, MW90-62, 1990, pp. 69-74). Since the frequency dispersion of sound velocity in the above-described boundary acoustic wave device of the related art was relatively large as compared to that of the structure dealt with in "Finite-Element Analysis of Periodically Perturbed Piezoelectric Waveguides", the $\kappa_{12}/k_0$ was determined based on the influence of the frequency dispersion.

The temperature coefficient of delay time TCD was determined from phase velocities $V_{15°\,C.}$, $V_{25°\,C.}$, and $V_{35°\,C.}$ at the stop-band lower edge of the short-circuit strip at about 15° C., about 25° C., and about 35° C. on the basis of the following formula (1).

$$TCD = \alpha_s - (V_{35°\,C.} - V_{15°\,C.})/V_{25°\,C.}(35-15) \qquad \text{Formula (I)}$$

In Formula (I), $\alpha_s$ represents the coefficient of linear expansion of the LiNbO$_3$ substrate in a propagation direction of boundary wave.

TABLE 1

| Configuration example of related art | SiO$_2$/IDT/15° Y—X LN |
|---|---|
| IDT(Al/Au) | thickness 0.050/0.035 λ, duty 0.6 |
| Second medium (SiO$_2$) | thickness 8 λ, transverse wave sound velocity 3757 m/sec, positive TCV |
| First medium (15° Y—X LiNbO$_3$) | thickness 8 λ, negative TCV |

The characteristics of the boundary acoustic wave device of the related art determined by the above-described calculation are shown in Table 2 described below.

TABLE 2

| Item | Propagation characteristics |
|---|---|
| Sound velocity V$_{25° C.}$ | 3495 m/sec |
| TCD | 26.8 ppm/° C. |
| K$^2$ | 17.4% |
| κ$_{12}$/k$_0$ | 0.096 |

On the other hand, the configurations of the IDT electrode 16 and the first medium 11 to the fourth medium 14 in the boundary acoustic wave device of the above-described preferred embodiment are shown in Table 3. As shown in Table 3 described below, the propagation characteristics were calculated as in the above-described boundary acoustic wave device of the related art. The results are shown in Table 4.

TABLE 3

| Preferred Embodiment | SiO$_2$/Ta$_2$O$_5$/SiO$_2$/IDT/15° Y—X LN |
|---|---|
| IDT(Al/Au) | thickness 0.050/0.035 λ, duty 0.6 |
| Fourth medium (SiO$_2$) | thickness 8 λ, transverse wave sound velocity 3757 m/sec, positive TCV |
| Third medium (Ta$_2$O$_5$) | thickness 0.03 λ, transverse wave sound velocity 1580 m/sec |
| Second medium (SiO$_2$) | thickness 0.2 λ, transverse wave sound velocity 3757 m/sec, positive TCV |
| First medium (15° Y—X LiNbO$_3$) | thickness 8 λ, negative TCV |

TABLE 4

| Item | Propagation characteristics |
|---|---|
| Sound velocity V$_{25° C.}$ | 3332 m/sec |
| TCD | 18.7 ppm/° C. |
| K$^2$ | 15.1% |
| κ$_{12}$/k$_0$ | 0.091 |

As shown from a comparison of Tables 2 and 4, according to the boundary acoustic wave device of the present preferred embodiment, the temperature coefficient of delay time is improved and is about 18.7 ppm/° C. That is, although the sound velocity, the electromechanical coefficient K$^2$, and the κ$_{12}$/k$_0$ were changed to some extent, these changes are within acceptable ranges. On the other hand, the temperature coefficient of delay time TCD is significantly improved.

The reason for the reduction of the absolute value and the improvement of the temperature coefficient of delay time TCD is believed to be as described below.

The temperature coefficient of delay time TCD of a boundary acoustic wave is determined based on the balance between the coefficient of linear expansion $\alpha_s$ of the total of the plurality of media defining boundaries and the temperature coefficients of sound velocity TCV in individual media. For example, when the temperature coefficient of delay time TCD of the boundary acoustic wave has a positive value, if the vibration energy distribution of the boundary wave is improved in a material in which the temperature coefficient of sound velocity TCV of transverse wave has a positive value, the temperature coefficient of delay time TCD of the boundary wave is reduced. The vibration energy of the boundary acoustic wave is concentrated on a medium having a low sound velocity. Therefore, when it is desired to concentrate the vibration energy of the boundary acoustic wave on one layer of the two layers, a low sound velocity material may be used for the one layer. Furthermore, when one medium is separated into two layers and a relatively low sound velocity medium is interposed between the separated two layers, the vibration energy is concentrated on the low sound velocity medium and, thereby, the vibration energy distribution into the above-described separated two layers is improved.

In the boundary acoustic wave device of the related art shown in Table 1, the temperature coefficient of delay time TCD has positive values. Therefore, it is believed that if the vibration energy on the SiO$_2$ layer side having a positive temperature coefficient of sound velocity TCV can be improved, then the temperature coefficient of delay time TCD can also be improved. Consequently, in the above-described preferred embodiment, as shown in Table 3, Ta$_2$O$_5$ defining the third medium in which the sound velocity of transverse wave is relatively low is disposed between the SiO$_2$ layers defining the second medium and the fourth medium. Therefore, the vibration energy of boundary wave in the second medium 12 and the fourth medium 14 made of SiO$_2$ having a positive temperature coefficient of sound velocity TCV is improved.

Figure 2:
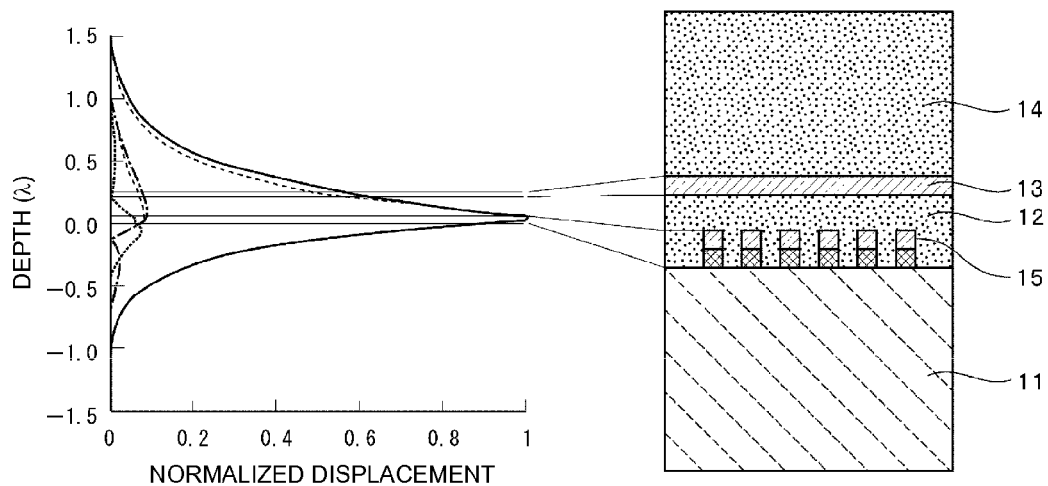
FIG. 2 is a schematic diagram showing vibration energy distribution states in individual medium layers in a boundary acoustic wave device of a preferred embodiment of the present invention.

FIG. 2 is a schematic diagram showing the displacement distributions of boundary acoustic waves in the above-described preferred embodiment and in the related art in which, in contrast to the above-described preferred embodiment, the third medium made of Ta$_2$O$_5$ is not provided. A solid line indicates the displacement distributions of the above-described preferred embodiment and a broken line indicates the displacement distributions of the related art. As is shown in FIG. 2, the vibration energy of the boundary acoustic wave in the second medium 12 and the fourth medium 14 is significantly improved by providing the third medium 13 made of Ta$_2$O$_5$.

Figure 3:
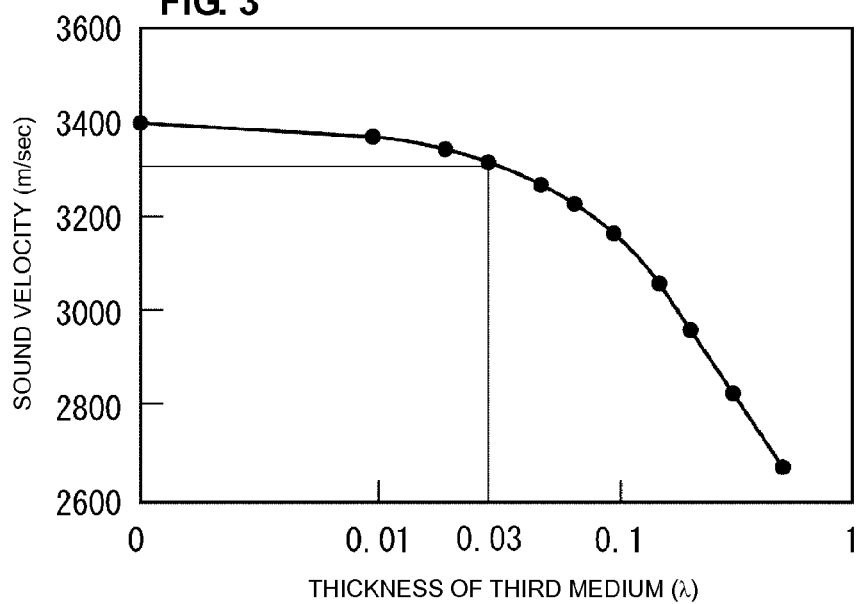
FIG. 3 is a diagram showing changes in sound velocity of a boundary acoustic wave when the film thickness of the third medium made of $Ta_2O_5$ is changed.
Figure 4:
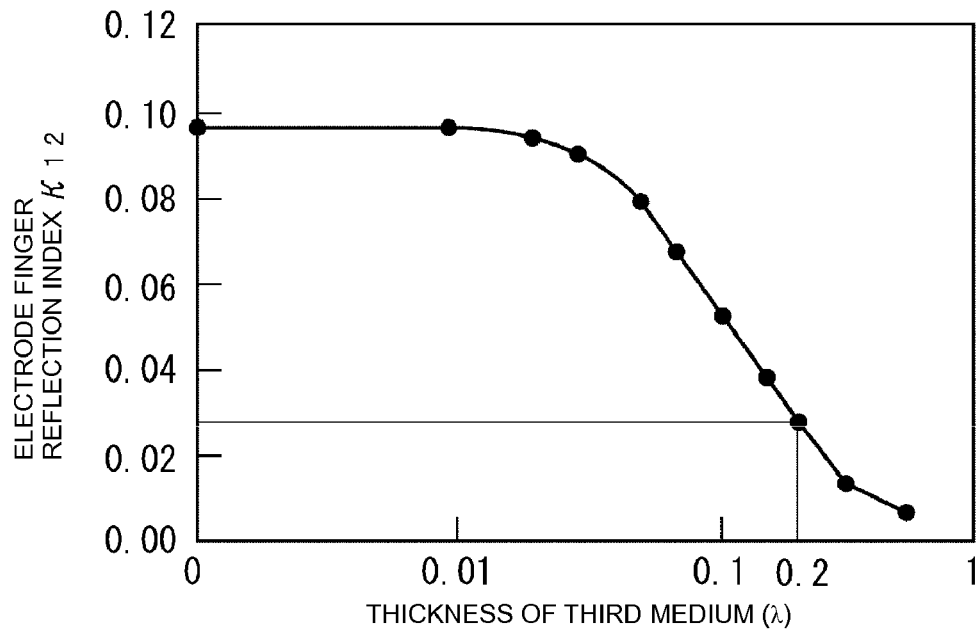
FIG. 4 is a diagram showing changes in split reflection index $\kappa_{12}$ of a boundary acoustic wave when the film thickness of the third medium made of $Ta_2O_5$ is changed.
Figure 5:
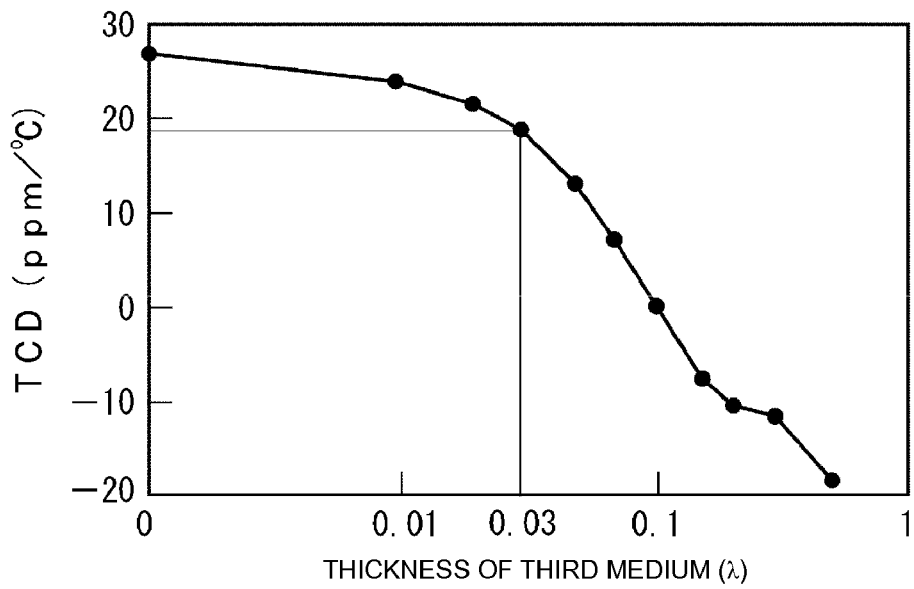
FIG. 5 is a diagram showing changes in temperature coefficient of delay time TCD of a boundary acoustic wave when the film thickness of the third medium made of $Ta_2O_5$ is changed.
Figure 6:
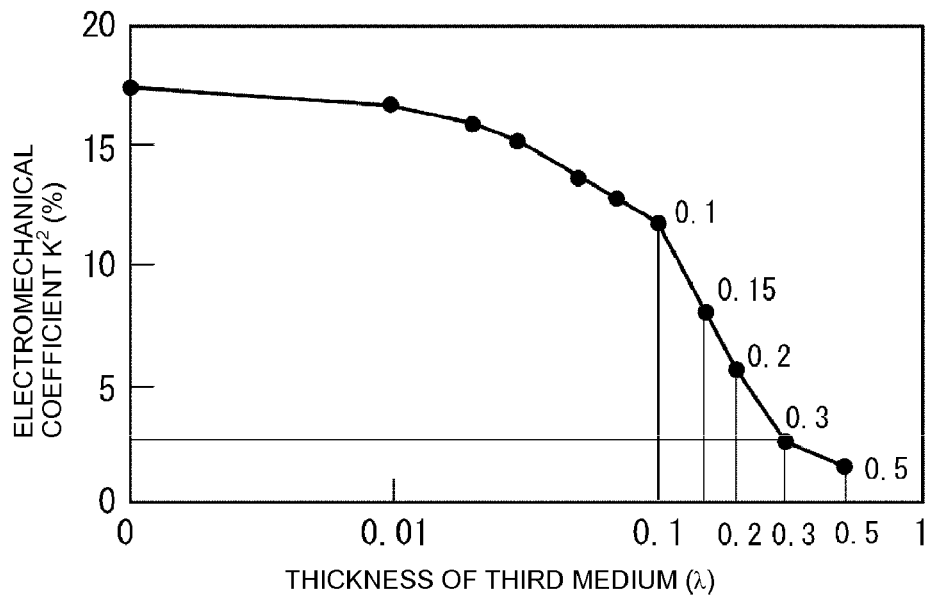
FIG. 6 is a diagram showing changes in electromechanical coefficient $K^2$ of a boundary acoustic wave when the film thickness of the third medium made of $Ta_2O_5$ is changed.

FIGS. 3 to 6 are diagrams showing the relationships between the thickness of the third medium 13 and the boundary acoustic wave propagation characteristics. Specifically, FIG. 3 is a diagram showing changes in sound velocity when the film thickness of the third medium 13 is changed. FIG. 4 is a diagram showing changes in strip reflection index. FIG. 5 is a diagram showing changes in temperature coefficient of delay time TCD. FIG. 6 is a diagram showing changes in electromechanical coefficient K$^2$ (%).

Figure 7:
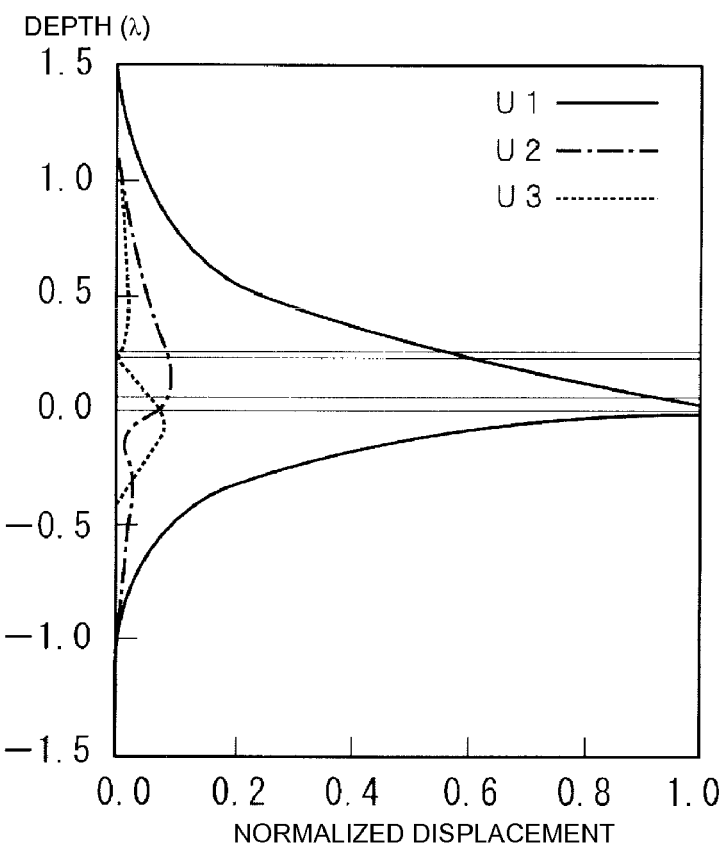
FIG. 7 is a diagram schematically showing the vibration energy distribution of a boundary acoustic wave device of a preferred embodiment of the present invention when the thickness of $Ta_2O_5$ defining the third medium is about $0.03\lambda$.
Figure 8:
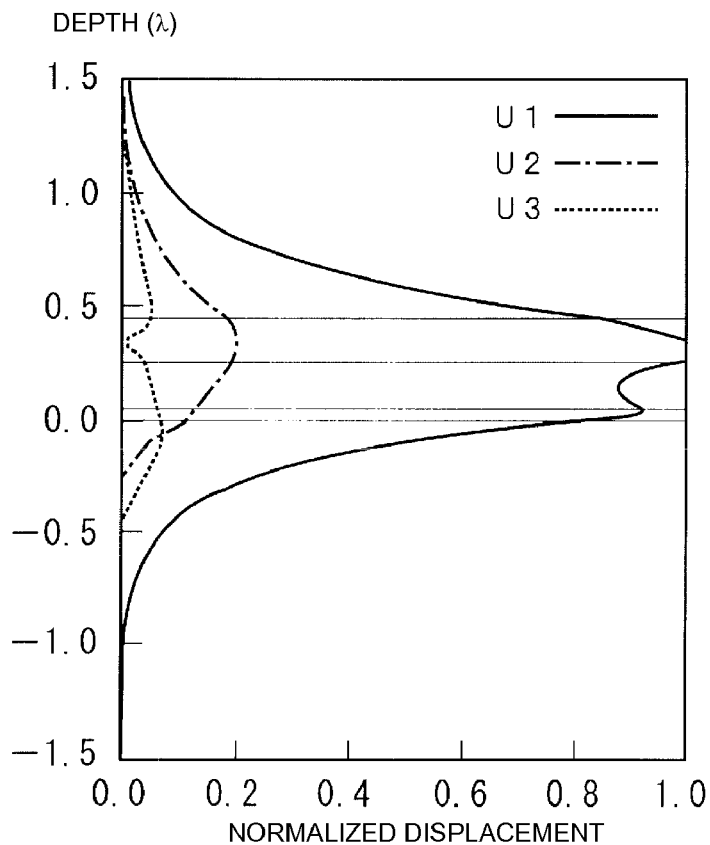
FIG. 8 is a diagram schematically showing the vibration energy distribution of a boundary acoustic wave device of a preferred embodiment of the present invention when the thickness of $Ta_2O_5$ defining the third medium is about $0.20\lambda$.

FIG. 7 is a schematic diagram showing the vibration energy distribution in the third medium made of Ta$_2$O$_5$ having a thickness of about 0.03λ. FIG. 8 is a schematic diagram showing the vibration energy distribution in the third medium made of Ta$_2$O$_5$ having a thickness of about 0.20λ.

As shown in FIG. 3, when the thickness of the third medium (Ta$_2$O$_5$) increases, the influence of the low sound velocity third medium increases and, thereby, the sound velocity of the boundary acoustic wave is reduced. For example, when the third medium is not provided, the sound velocity is about 3,394 m/s, whereas when the thickness of the third medium is about 0.03λ, the sound velocity is about 3,332 m/s. Furthermore, if the thickness of the third medium ($Ta_2O_5$) is increased, the temperature coefficient of delay time TCD shifts to the negative side, as shown in FIG. 5, due to the above-described principle. For example, TCD is about 27 ppm/° C. when the third medium is not provided, whereas TCD is about 18 ppm/° C. when the thickness of the third medium is about 0.03λ. Moreover, as shown in FIGS. 7 and 8, as the thickness of $Ta_2O_5$ increases to about 0.20λ, the vibration energy distributed into the $LiNbO_3$ substrate decreases, and the electromechanical coefficient $K^2$ is reduced. That is, when the thickness of the $Ta_2O_5$ is about 0.3λ, as shown in FIG. 6, the electromechanical coefficient $K^2$ is reduced to about 2.4%.

Furthermore, as shown in FIG. 4, as the thickness of the third medium 13 made of $Ta_2O_5$ increases, the $\kappa_{12}$ indicating the reflection coefficient of the strip is reduced. In particular, when the thickness of $Ta_2O_5$ is about 0.2λ, the $\kappa_{12}$ is about 0.026. Therefore, if the $\kappa_{12}$ is less than about 0.026, it is necessary to increase the number of reflectors of the one-port type boundary acoustic wave resonator of the above-described preferred embodiment in which strip type reflectors 17 and 18 are disposed at both sides of the IDT electrode 16 in the propagation direction of the boundary acoustic wave. And, when a longitudinally coupled resonator filter is provided, which is a boundary acoustic wave device having a resonator structure, the number of reflector is increased. Consequently, disadvantageously, the size of the boundary acoustic wave device is increased. Therefore, the thickness of the third medium 13 made of $Ta_2O_5$ is preferably about 0.30λ or less, for example, and more preferably about 0.20λ or less.

Next, a one-port type boundary acoustic wave device was prepared according to the above-described preferred embodiment, and the temperature coefficient of resonant frequency TCF and the ratio of the band width to the frequency were measured.

That is, the period λ of the IDT electrode 16, the configuration and the thickness of the IDT electrode 16, the film thicknesses and materials of the first medium 11 to the fourth medium 14 were set as shown in Table 5 described below.

Furthermore, the design parameters of the IDT electrode 16 were specified as described below.

The number of pairs of electrode fingers: 60 pairs
Intersection width: about 30λ
Opening width: about 30.4λ
Apodization: presence, intersection width of center of IDT about 30λ, intersection width of both ends of IDT about 15λ
The number of electrode fingers of reflector: 51 fingers
Period of IDT and reflector λ: about 3.42 μm (electrode fingers disposition pitch about 0.8 μm)
Line width of electrode fingers: about 0.855 μm
Space width between electrode fingers: about 0.855 μm

TABLE 5

| Item | Dimension |
|---|---|
| IDT period A | 3.42 μm |
| IDT(NiCr/Ti/Al/Ti/Ni/Au/Ni/Ti) | thickness 20/20/100/20/20/140/20/20 nm |
| Fourth medium ($SiO_2$) | thickness 6000 nm |
| Third medium ($Ta_2O_5$) | thickness 170 nm |
| Second medium ($SiO_2$) | thickness 680 nm |
| First medium (15° Y—X $LiNbO_3$) | thickness 500 μm |

Figure 9:
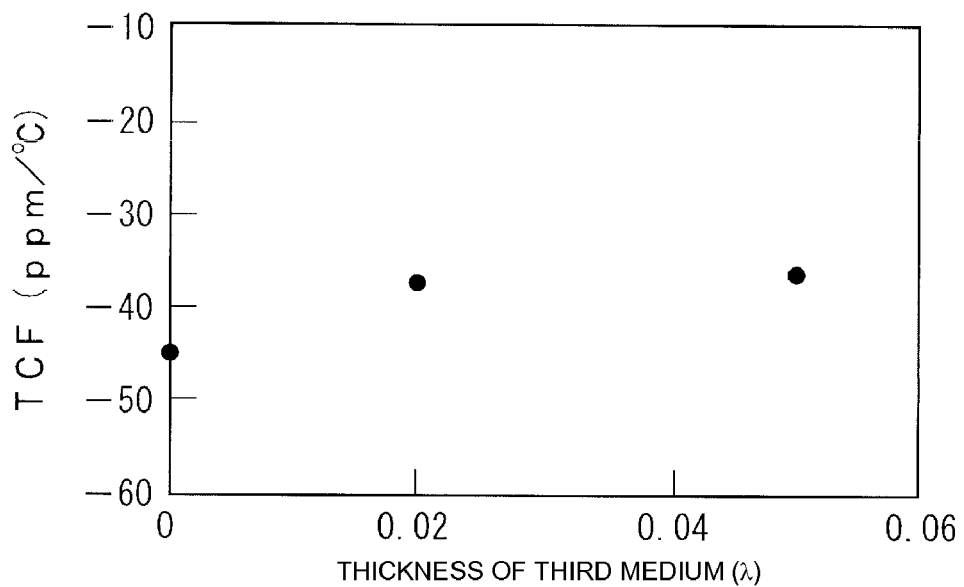
FIG. 9 is a diagram showing the temperature coefficients of resonant frequency TCF when the thickness of the third medium made of $Ta_2O_5$ is about $0.02\lambda$ and about $0.05\lambda$ and when the third medium is not laminated.
Figure 10:
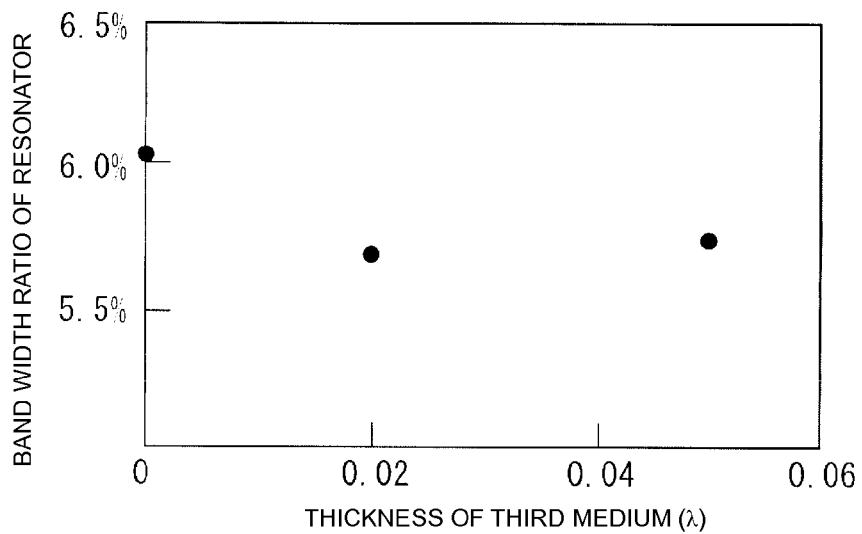
FIG. 10 is a diagram showing the ratios of bandwidth to the frequency of a resonator when the thickness of the third medium made of $Ta_2O_5$ is about $0.02\lambda$ and about $0.05\lambda$ and when the third medium is not laminated.

The thickness of the third medium 13 was set to about 170 nm, that is, about 0.05λ. However, in addition, a boundary acoustic wave device of a modified example was prepared, in which the thickness of the third medium 13 was set to about 0.02λ(68 nm). Furthermore, for the purposes of comparison, a boundary acoustic wave device was prepared as in the above-described prototype example of a preferred embodiment of the present invention, except that the thickness of the third medium was 0λ, that is, the third medium 13 was not provided. The temperature coefficient of resonant frequency TCF and the ratio of the band width to the frequency were measured. The results are shown in FIGS. 9 and 10. Here, the ratio of the band width to the frequency was determined from (anti-resonant frequency−resonant frequency)/resonant frequency.

As shown in FIGS. 9 and 10, in the specifically prototyped boundary acoustic wave devices of the above-described embodiment and the modified example, the absolute values of the temperature coefficients of resonant frequency TCF can be reduced as compared to that of the boundary acoustic wave device that does not include the third medium, and the ratio of the band width to the frequency does not change significantly. Therefore, it is clear that the frequency temperature characteristic can be improved without reducing the ratio of the band width to the frequency.

Figure 11:
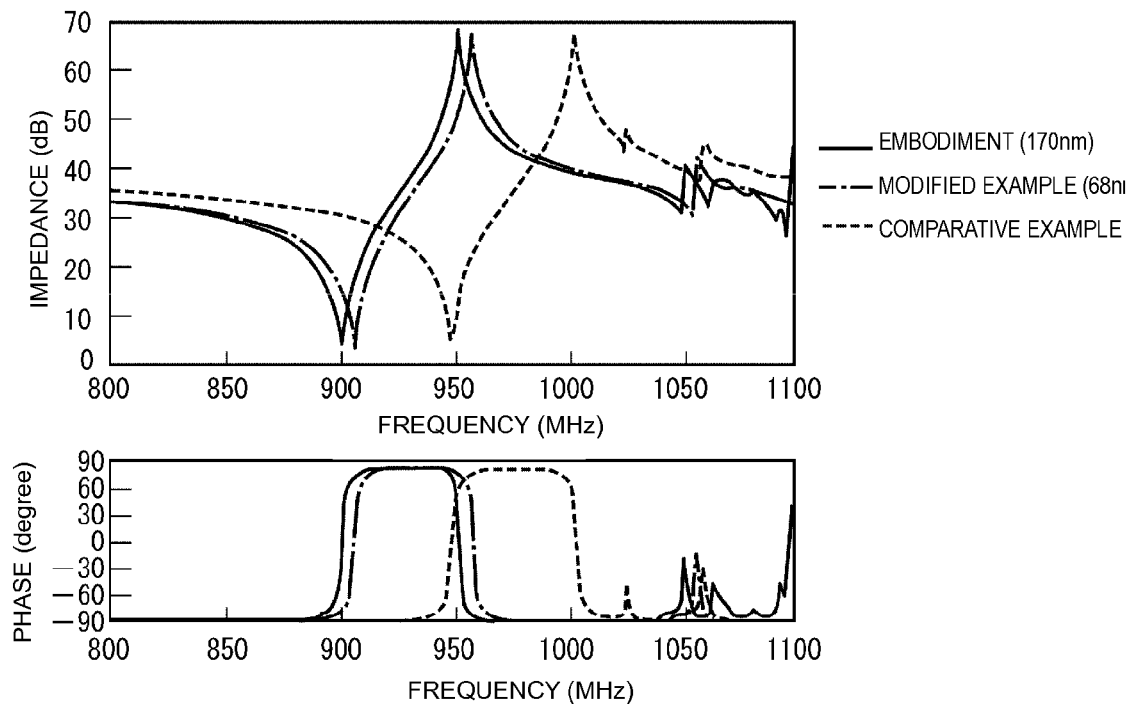
FIG. 11 is a diagram showing the impedance frequency characteristic and the phase frequency characteristic of individual boundary acoustic wave devices in which the thickness of $Ta_2O_5$ defining the third medium is about $0.02\lambda$, the thickness is about $0.05\lambda$, and the third medium is not laminated.
Figure 12:
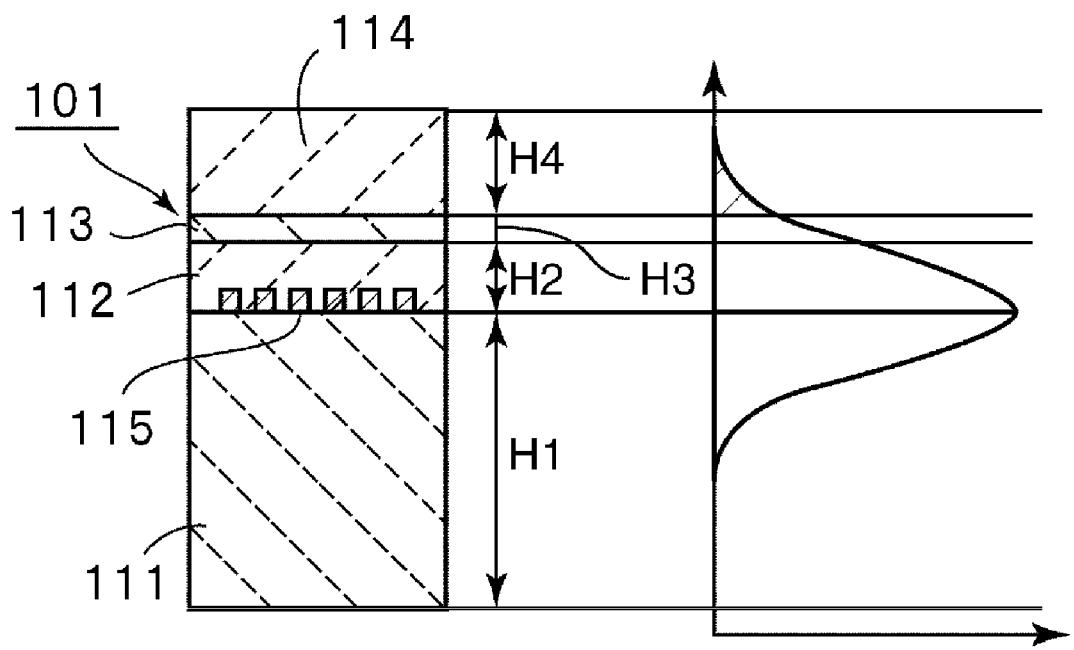
FIG. 12 is a schematic sectional front view for explaining an example of boundary acoustic wave devices in related art.

FIG. 11 is a diagram showing the impedance and the phase characteristics of three types of boundary acoustic wave devices prepared as described above. As shown in FIG. 11, regarding the boundary acoustic wave devices of the preferred embodiment and the modified example, in which the third medium 13 was provided, the impedance ratio, that is, the top-to-valley ratio, which is a ratio of the impedance at an anti-resonant frequency to the impedance at a resonant frequency is relatively large as compared to that of the comparative example in which the third medium is not provided, and therefore, the characteristics are improved.

Most piezoelectric materials have negative temperature coefficients of sound velocity TCV, and devices thereof have negative temperature coefficients of resonant frequency TCF. Therefore, the temperature coefficient of resonant frequency TCF of the device can be corrected to the positive side by using a material having a positive temperature coefficient of sound velocity TCV for the second medium 12 and the fourth medium 14. The usability can be improved by using $SiO_2$ having a positive temperature coefficient of sound velocity TCV as the second medium 12 and the fourth medium 14. That is, the absolute value of the temperature coefficient of resonant frequency TCF can be reduced. On the other hand, $Ta_2O_5$ has a low sound velocity, and is a relatively heavy, hard dielectric material. Therefore, when thin $Ta_2O_5$ defining the third medium 13 is disposed between the second medium 12 and the fourth medium 14 made of $SiO_2$, the energy can be shifted from the first medium 11 to the second medium 12 side. Furthermore, $SiO_2$ and $Ta_2O_5$ have outstanding heat resistance and are chemically stable. Consequently, the boundary acoustic wave device 1 of the above-described preferred embodiment not only exhibits small changes in characteristics due to temperature, but also exhibits outstanding heat resistance and stability. In addition, the reliability is also outstanding. Moreover, the second medium 12 and the fourth medium 14 may be made of different materials.

In the above-described preferred embodiment, the temperature coefficient of delay time TCD of the boundary acoustic wave has a positive value with the configuration in which the fourth medium/the second medium/the electrode/ the first medium are laminated. In the configuration, the fourth medium or the second medium preferably have a positive temperature coefficient of sound velocity TCV and the first medium preferably has a negative temperature coefficient of sound velocity TCV. However, preferred embodiments of the present invention are not limited to this configuration. The delay time temperature characteristic can also be improved with a configuration in which the sound velocity of transverse wave in the third medium is set to be less than that in the fourth medium and/or the second medium, and with configurations in which, conversely, the sound velocity of transverse wave in the third medium is set to be greater that in the fourth medium and/or the second medium.

According to a modification of the above-described preferred embodiment of the present invention, the temperature coefficient of delay time TCD of the boundary acoustic wave has a negative value in the laminated structure of the fourth medium/the second medium/the electrode/the first medium, the fourth medium or the second medium has a negative temperature coefficient of sound velocity TCV, and the first medium has a positive temperature coefficient of sound velocity TCV.

According to another modification of the above-described preferred embodiment of the present invention, the temperature coefficient of delay time TCD of the boundary acoustic wave has a positive value in the laminated structure of the fourth medium/the second medium/the electrode/the first medium, the fourth medium or the second medium has a negative temperature coefficient of sound velocity TCV, and the first medium has a positive temperature coefficient of sound velocity TCV.

According to another modification of the above-described preferred embodiment of the present invention, the temperature coefficient of delay time TCD of the boundary acoustic wave has a negative value in the laminated structure of the fourth medium/the second medium/the electrode/the first medium, the fourth medium or the second medium has a positive temperature coefficient of sound velocity TCV, and the first medium has a negative temperature coefficient of sound velocity TCV.

In the above-described preferred embodiment, the one-port type boundary acoustic wave resonator has been described. However, the boundary acoustic wave device according to preferred embodiments of the present invention can be configured to have various electrode structures. That is, the boundary acoustic wave device may be a longitudinally coupled or transversely coupled boundary acoustic wave resonator filter including at least two IDTs or a ladder filter in which a plurality of boundary acoustic wave resonators are connected in a ladder arrangement. Furthermore, the acoustic wave device according to preferred embodiments of the present invention can be used for optical devices, e.g., boundary acoustic wave optical switches and boundary acoustic wave optical filters, and be widely used for general devices that utilize the boundary acoustic wave.

In the production of the boundary acoustic wave device according to preferred embodiments of the present invention, prior to the formation of the second medium 12, the third medium 13, and the fourth medium 14, the thicknesses of the IDT electrode 16, the second medium 12, and/or the third medium 13 can preferably be adjusted by reducing the thicknesses of the IDT electrode and the second medium 12 or the third medium 13 through reverse sputtering, ion beam milling, reactive ion etching, wet etching, polishing, for example, or by increasing the thickness through additional film formation by sputtering or a deposition method, e.g., evaporation.

In a preferred embodiment of the present invention, as shown in Table 5, the electrode structure may preferably be made of a laminated film including a plurality of metals.

Furthermore, the materials defining the first medium to the fourth medium in preferred embodiments of the present invention are not specifically limited. That is, various dielectric materials can be used as the media. Examples of such media include one type selected from the group consisting of lithium niobate, potassium niobate, lithium tantalate, lithium tetraborate, langasite, langanite, quartz, PZT, ZnO, AlN, silicon oxide, glass, silicon, sapphire, silicon nitride, and carbon nitride.

Moreover, the medium is not necessarily made of a single material, and may have a laminated structure in which a plurality of medium layers are laminated. That is, at least one medium of the first medium to the fourth medium may have a laminated structure in which a plurality of material layers are laminated.

In addition, the boundary acoustic wave device according to preferred embodiments the present invention may be provided with an external protective layer to improve the strength and to prevent infiltration of corrosive gases and other contaminants. The boundary acoustic wave device may be enclosed in a package if size reduction is not required.

The above-described protective layer may be made of insulating materials, e.g., titanium oxide, aluminum nitride, and aluminum oxide, may be made of metal films of Au, Al, W, and other suitable metal films, and may be made of resin films of epoxy resins and other suitable resin films.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A boundary acoustic wave device comprising:
 a first medium, a second medium, a third medium, and fourth medium laminated in that order; and
 an electrode disposed at an interface between the first medium and the second medium; wherein
 a temperature coefficient of delay time of a boundary acoustic wave generated in the boundary acoustic wave device has a positive value;
 at least one of the fourth medium and the second medium has a positive temperature coefficient of sound velocity and the first medium has a negative temperature coefficient of sound velocity; and
 a sound velocity of transverse wave in the third medium is less than a sound velocity of transverse wave in at least one of the fourth medium and the second medium.

2. The boundary acoustic wave device according to claim 1, wherein the first medium is made of a piezoelectric substrate, the second medium is made of a silicon oxide film, the third medium is made of one of a tantalum oxide film and a zinc oxide film, and the fourth medium is made of a silicon oxide film.

3. The boundary acoustic wave device according to claim 1, wherein the electrode includes at least one IDT electrode.

4. A boundary acoustic wave device comprising:
 a first medium, a second medium, a third medium, and a fourth medium laminated in that order; and
 an electrode disposed at an interface between the first medium and the second medium; wherein
 a temperature coefficient of delay time of a boundary acoustic wave generated in the boundary acoustic wave device has a negative value;
 at least one of the fourth medium and the second medium has a negative temperature coefficient of sound velocity and the first medium has a positive temperature coefficient of sound velocity; and
 a sound velocity of transverse wave in the third medium is less than a sound velocity of transverse wave in at least one of the fourth medium and the second medium.

5. The boundary acoustic wave device according to claim 4, wherein the electrode includes at least one IDT electrode.

6. A boundary acoustic wave device comprising:
 a first medium, a second medium, a third medium, and a fourth medium laminated in that order; and an electrode disposed at an interface between the first medium and the second medium; wherein a temperature coefficient of delay time of a boundary acoustic wave generated in the boundary acoustic wave device has a positive value, at least one of the fourth medium and the second medium has a negative temperature coefficient of sound velocity and the first medium has a positive temperature coefficient of sound velocity; and a sound velocity of transverse wave in the third medium is greater than the sound velocity of transverse wave in at least one of the fourth medium and the second medium.

7. The boundary acoustic wave device according to claim 6, wherein the electrode includes at least one IDT electrode.

8. A boundary acoustic wave device comprising:

a first medium, a second medium, a third medium, and a fourth medium laminated in that order; and an electrode disposed at an interface between the first medium and the second medium; wherein a temperature coefficient of delay time of a boundary acoustic wave generated in the boundary acoustic wave device has a negative value;

at least one of the fourth medium and the second medium has a positive temperature coefficient of sound velocity and the first medium has a negative temperature coefficient of sound velocity; and a sound velocity of transverse wave in the third medium is greater than the sound velocity of transverse wave in at least one of the fourth medium and the second medium.

9. The boundary acoustic wave device according to claim 8, wherein the first medium is made of a piezoelectric substrate, the second medium and the fourth medium are made of silicon oxide films, and the third medium is made of a silicon film or a silicon nitride film.

10. The boundary acoustic wave device according to claim 8, wherein the electrode includes at least one IDT electrode.

* * * * *